United States Patent
Chang et al.

(10) Patent No.: US 10,285,308 B1
(45) Date of Patent: May 7, 2019

(54) DYNAMIC RANDOM ACCESS MEMORY MODULE

(71) Applicant: ADATA TECHNOLOGY CO., LTD., New Taipei (TW)

(72) Inventors: Li-Min Chang, Taipei (TW); Feng-Mi Tsai, New Taipei (TW); Shih-Huang Tsai, New Taipei (TW); Ching-Sen Chan, Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/954,227

(22) Filed: Apr. 16, 2018

(30) Foreign Application Priority Data

Jan. 5, 2018 (TW) .............................. 107100536 A

(51) Int. Cl.
| | |
|---|---|
| *H05K 7/20* | (2006.01) |
| *H05K 7/14* | (2006.01) |
| *H05K 1/18* | (2006.01) |
| *H05K 5/06* | (2006.01) |
| *F21Y 113/10* | (2016.01) |

(Continued)

(52) U.S. Cl.
CPC ......... *H05K 7/20236* (2013.01); *H05K 1/181* (2013.01); *H05K 5/069* (2013.01); *H05K 7/1427* (2013.01); *F21V 29/503* (2015.01); *F21V 29/508* (2015.01); *F21V 29/58* (2015.01); *F21V 29/87* (2015.01); *F21Y 2113/10* (2016.08);

(Continued)

(58) Field of Classification Search
CPC .... H05K 7/20236; H05K 5/069; H05K 1/181; H05K 7/1427; H05K 2201/10159; H05K 2201/064; H05K 2201/10121; F21Y 2113/10; F21V 29/508; F21V 29/503; F21V 29/58; F21V 29/87
See application file for complete search history.

(56) References Cited

U.S. PATENT DOCUMENTS

| | | | | |
|---|---|---|---|---|
| 6,052,284 A | * | 4/2000 | Suga ..................... | H01L 23/473 165/80.4 |
| 6,411,507 B1 | * | 6/2002 | Akram ................ | H01L 23/3675 361/690 |

(Continued)

FOREIGN PATENT DOCUMENTS

| | | | | |
|---|---|---|---|---|
| JP | WO 2016117098 A1 | * | 7/2016 | ............... G06F 1/20 |
| JP | WO 2016178322 A1 | * | 11/2016 | ............... F21S 2/00 |
| TW | I345719 B | | 7/2011 | |

OTHER PUBLICATIONS

Perfluorotripropylamine—www.chemicalbook.com/ChemicalProductProperty_EN_CB3404898.htm. 2017.*

*Primary Examiner* — Anh T Mai
*Assistant Examiner* — Glenn Zimmerman
(74) *Attorney, Agent, or Firm* — Li & Cai Intellectual Property (USA) Office

(57) ABSTRACT

The instant disclosure provides a dynamic random access memory (DRAM) module including a housing, a circuit board and a fluorine engineered fluid. The housing includes an accommodating space and an opening on a side thereof. The circuit board has at least a DRAM chip disposed thereon. The circuit board is received in the accommodating space and one end of the circuit board has at least a circuit contact protruding from the opening to the exterior of the housing. The fluorine electronic engineering fluid is sealed in the accommodating space and is thermally connected to at least one of the DRAM chip.

12 Claims, 6 Drawing Sheets

(51) Int. Cl.
*F21V 29/87* (2015.01)
*F21V 29/58* (2015.01)
*F21V 29/503* (2015.01)
*F21V 29/508* (2015.01)

(52) U.S. Cl.
CPC ............... *H05K 2201/064* (2013.01); *H05K 2201/10121* (2013.01); *H05K 2201/10159* (2013.01)

(56) References Cited

U.S. PATENT DOCUMENTS

| | | | |
|---|---|---|---|
| 7,876,564 B2* | 1/2011 | Monh | F28D 15/0266 165/104.33 |
| 8,081,473 B2* | 12/2011 | Cipolla | H01L 23/4093 165/104.33 |
| 2005/0127322 A1* | 6/2005 | Costello | C07C 43/126 252/71 |
| 2007/0034360 A1* | 2/2007 | Hall | G06F 1/183 165/104.33 |
| 2008/0123294 A1* | 5/2008 | Tsai | G06F 1/20 361/695 |
| 2011/0100601 A1* | 5/2011 | Flynn | C09K 5/10 165/104.19 |
| 2013/0146273 A1* | 6/2013 | Chester | H05K 7/20772 165/287 |
| 2015/0223316 A1* | 8/2015 | Fujino | H01L 24/37 361/717 |
| 2016/0262287 A1 | 9/2016 | Chester et al. | |
| 2017/0142827 A1* | 5/2017 | Cheng | H05K 1/0274 |
| 2017/0273223 A1 | 9/2017 | Saito | |
| 2017/0332514 A1 | 11/2017 | Saito | |
| 2017/0354061 A1 | 12/2017 | Saito | |
| 2018/0020571 A1* | 1/2018 | Saito | G06F 1/20 |
| 2018/0049318 A1* | 2/2018 | Maki | F21S 2/00 |

\* cited by examiner

DYNAMIC RANDOM ACCESS MEMORY MODULE

BACKGROUND

1. Technical Field

The instant disclosure relates to a dynamic random access memory module, and in particular, to a dynamic random access memory module including a housing with a fluorine engineering fluid filled therein.

2. Description of Related Art

The performance of a dynamic random access memory module (DRAM) is highly related to the working temperature. In order to ensure that the DRAM operates under optimum temperature, heat-dissipation solutions are among the most important topics in relevant industries.

Heat-dissipation of the products (such as the dynamic random access memories) in the existing art is generally achieved by the following approaches: contacting the products with metals for removing heat by thermal-conductance, using a fan for generating convection, or utilizing indirect heat dissipation by connecting metal thermal sheets to a thermal conducting fluid. However, in actual implementations, the use of a fan is not very effective, and the effectiveness achieved by the use of metals directly contacting the products and the use of metal thermal sheets and thermal conducting fluids are limited by the heat conducting path. Specifically, the sufficiency of the contacting area and the uniformity of the thermal-conducting efficiency must be taken into consideration. In addition, the use of metal thermal sheets and thermal conducting fluids would be met with the problem of multi-media transferring along the thermal conduction path, and hence, the heat dissipation efficiency thereof is unsatisfactory

SUMMARY

The problem to be solved by the instant disclosure is to provide a dynamic random access memory module for maintaining the dynamic random access memory chip at an optimum working temperature.

In order to achieve the object above, an embodiment of the instant disclosure provides a dynamic random access memory module including a housing, a circuit board and a fluorine engineering fluid. The housing has an accommodating space therein and an opening on a side thereof. The circuit board includes at least a dynamic random access memory chip disposed thereon and received in the accommodating space. An end of the circuit board has an electrical contact protruding from the opening toward the exterior of the housing. The fluorine engineering fluid is sealed in the accommodating space and thermally connected to the dynamic random access memory chip Preferably, the fluorine engineering fluid contains a compound represented by the following formula: $R_f$—O—$R_h$—O—$R_f'$. $R_f$ and $R_f'$ are same or different and each contains one hydrogen atom. $R_h$ is a linear, cyclic or branched alkylene containing 2 to 8 carbon atoms and at least 4 hydrogen atoms. The compound does not contain —O—$CH_2$—O—. Preferably, $R_f$ and $R_f'$ each contains at least 2 carbon atoms and at least 3 fluorine atoms.

Preferably, the fluorine engineering fluid includes a compound represented by the following formula: Y—$R_f$—$CH_2OCH_2R_f'$—Y. $R_f$ and $R_f'$ are same or different and each contains at most one hydrogen atom and is selected from the group consisting of linear, cyclic or branched perfluororinated alkylene groups having from 1 to 10 carbon atoms, linear, cyclic or branched partially fluorinated alkylene groups having from 1 to 10 carbon atoms, and derivatives thereof wherein one or more carbon atoms are replaced by catenated nitrogen or oxygen heteroatoms. Y is selected from a group consisting of H, F and $R_fCH_2OCH_2$ group. The compound contains at least 6 carbon atoms. Preferably, at least one of $R_f$ and $R_f'$ contains 3 to 8 carbon atoms, and at least one of $R_f$ and $R_f'$ contains at least 3 fluorine atoms.

Preferably, the fluorine engineering fluid further includes perfluoro-tri-n-propylamine.

Preferably, the housing includes a liquid inlet filled with an anti-leaking gel.

Preferably, the housing has at least a light transmittable portion and the circuit board has at least a light-emitting module disposed thereon, the light-emitting module being received in the accommodating space, and a light emitted by the light-emitting module passing through the light transmittable portion. Preferably, the light-emitting module includes a red light emitting unit, a green light emitting unit and a blue light emitting unit.

Preferably, the housing is provided with at least a first engaging portion and the circuit board is provided with at least a second engaging portion, the first engaging portion and the second engaging portion being engaged with each other.

One of the advantages of the instant disclosure is that the dynamic random access memory module provided by the instant disclosure can be maintained at an optimum working temperature for allowing the dynamic random access memory module to be operated under optimal efficiency by the technical feature of "the fluorine engineering fluid is sealed in the accommodating space" and "the fluorine engineering fluid is thermal connected to the dynamic random access memory chip".

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
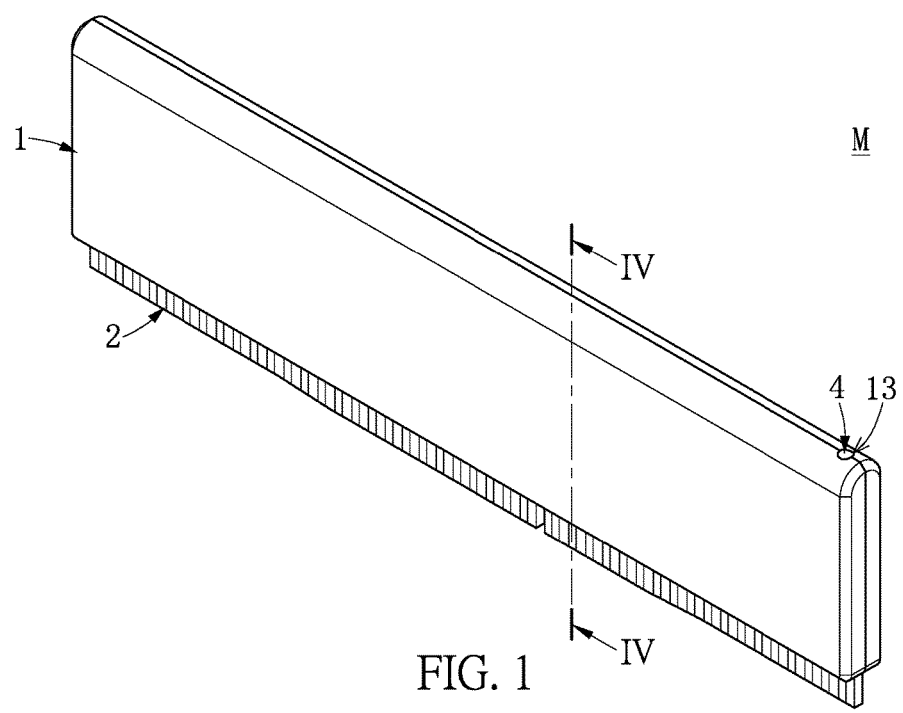
FIG. 1 is an assembly perspective schematic view of a dynamic random access memory module of a first embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

It is noted that the term "first", "second" and "third" for describing different elements or signals are only used to distinguish these elements/signals from one another rather than limiting the nature thereof. In addition, the term "or" used in the specification may include one or more of the listed items.

First Embodiment

Figure 2:
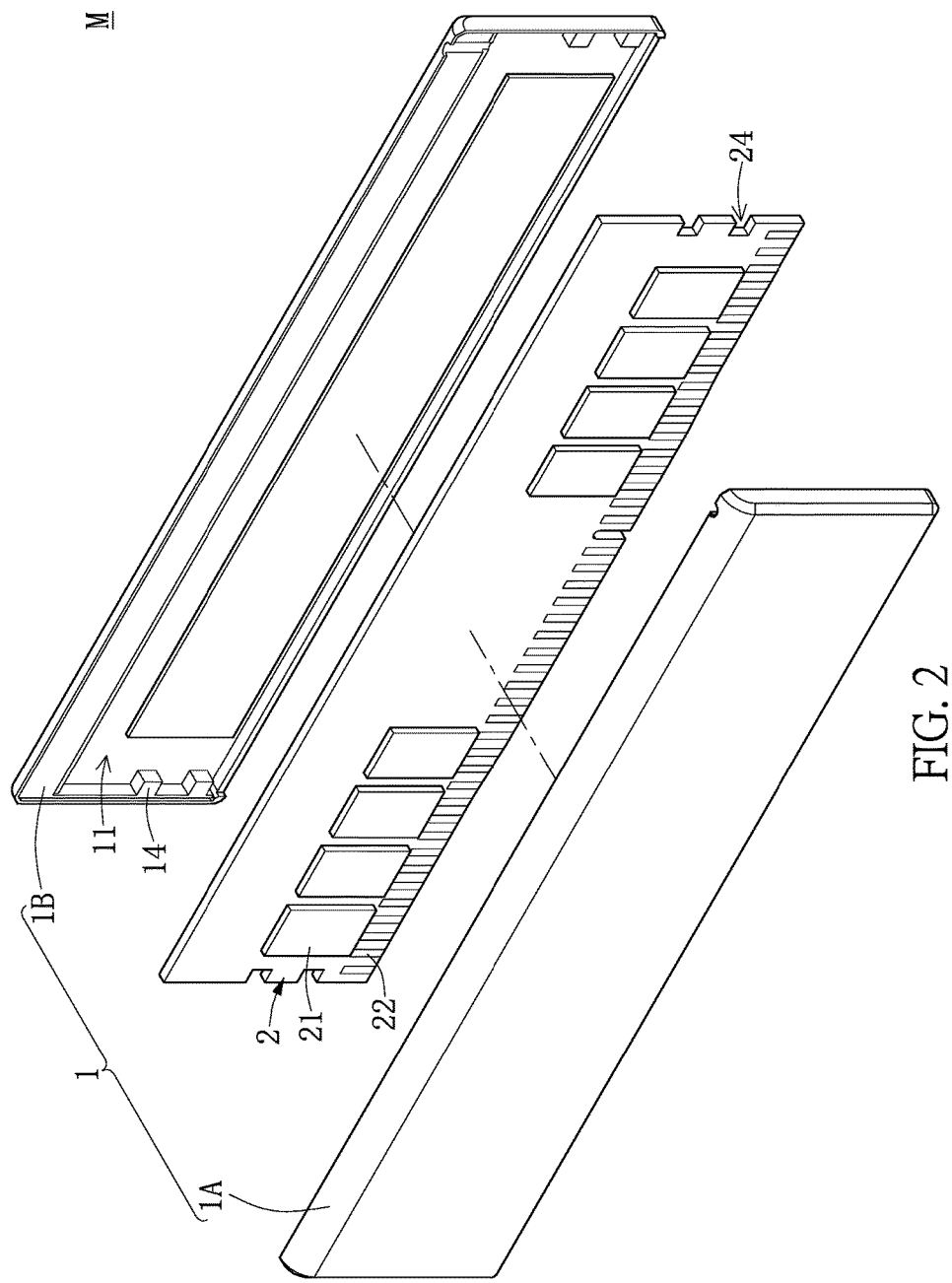
FIG. 2 is an exploded perspective schematic view of the dynamic random access memory module of the first embodiment of the instant disclosure.
Figure 3:
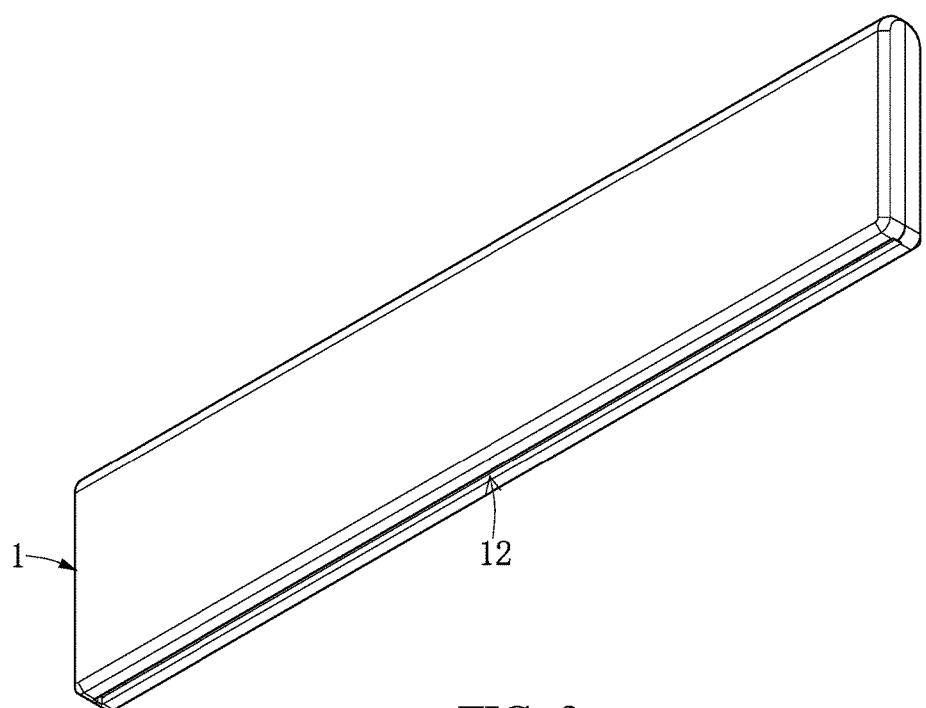
FIG. 3 is an assembly perspective schematic view of a housing of the first embodiment of the instant disclosure.
Figure 4:
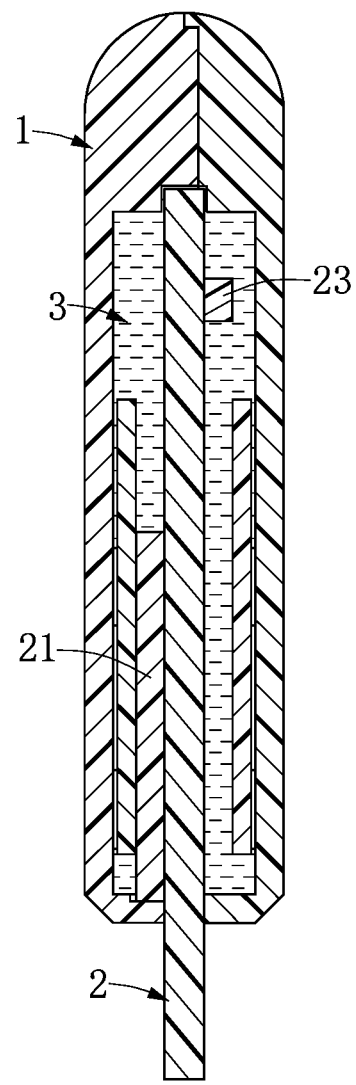
FIG. 4 is a sectional schematic view of the dynamic random access memory module of the first embodiment of the instant disclosure taken from line IV-IV of FIG. 1.

Reference is made to FIG. 1 to FIG. 4. FIG. 1 is an assembly perspective schematic view of a dynamic random access memory (DRAM) module M of a first embodiment of the instant disclosure, FIG. 2 is an exploded perspective schematic view of the DRAM module M of the first embodiment of the instant disclosure, FIG. 3 is an assembly perspective schematic view of a housing of the first embodiment of the instant disclosure, and FIG. 4 is a sectional schematic view of the dynamic random access memory module of the first embodiment of the instant disclosure taken from line IV-IV of FIG. 1. As shown in the figures, the DRAM module M provided by the first embodiment of the instant disclosure includes a housing 1, a circuit board 2 and a fluorine engineered fluid 3. The housing 1 has an accommodating space 11 therein, and the circuit board 2 is disposed in the housing 1. The fluorine engineered fluid 3 is sealed in the accommodating space 11.

As shown in FIG. 2 and FIG. 3, in the present embodiment, the housing 1 includes an upper casing 1A and a lower casing 1B. The accommodating space 11 is formed between the upper casing 1A and the lower casing 1B after the upper casing 1A and the lower casing 1B are combined (assembled) with each other. A side of the casing 1 has an opening 12 which is communicated with the accommodating space 11 in the housing 1.

In the present embodiment, at least a DRAM chip 21 is disposed on the circuit board 2, and an end of the circuit board 2 has at least a circuit connecting point 22 disposed thereon. The circuit connecting point 22 and the DRAM chip 21 are electrically connected to each other. Specifically, the circuit board 2 is disposed in the housing 1 for receiving the DRAM chip 21 in the accommodating space 11, and for allowing the end of the circuit board 2 having the circuit connecting point 22 to protrude from the opening 12 towards an exterior of the housing 1.

As shown in FIG. 2 and FIG. 3, in some embodiments of the instant disclosure, the casing 1 has at least a first engaging portion 14 and the circuit board 2 has at least a second engaging portion 24. In the present embodiment, the first engaging portion 14 includes a plurality of engaging protrusions corresponding to the accommodating space 11, and the second engaging portion 24 includes a plurality of engaging grooves arranged along the edge of the circuit board 2. When the circuit board 2 is installed in the housing 1, the first engaging portion 14 and the opening 12 can engage with each other for stably fixing the circuit board 2 on the housing 1. However, in actual implementations, the specific structures of the first engaging portion 14 and the second engaging portion 24 are not limited. For example, the second engaging portion 24 can include through holes on the circuit board 2 and the first engaging portion 14 can include columns passing through the through holes.

Specifically, the circuit board 2 is disposed between the upper casing 1A and the lower casing 1B. Therefore, when the upper casing 1A and the lower casing 1B are combined with each other, a part of the circuit board 2 with the DRAM chip 21 disposed thereon is received in the accommodating space 11, and the first engaging portion 14 and the second engaging portion 24 engage with each other. The end of the circuit board 2 with the circuit connecting point 22 disposed thereon protrudes from the DRAM chip 21 toward the exterior of the housing 1.

Referring to FIG. 1, in the present embodiment, the housing 1 has a liquid inlet 13 located at a side opposite to the opening 12 for inputting the fluorine engineered fluid 3 from the liquid inlet 13 to the accommodating space 11. Since an anti-leakage gel 4 is filled from the liquid inlet 13 of the DRAM module M, after the fluorine engineered fluid 3 is input into the accommodating space 11, the anti-leakage gel 4 can seal the liquid inlet 13 for sealing the accommodating space 11 and preventing the fluorine engineered fluid 3 from leaking.

Reference is made to FIG. 4. The fluorine engineered fluid 3 of the instant disclosure is sealed in the accommodating space 11, and the fluorine engineered fluid 3 is thermally connected to a DRAM chip 21. Therefore, the heat generated during the operation of the DRAM chip 21 can be uniformly transferred to the fluorine engineered fluid 3, and the fluorine engineered fluid 3 can further transfer the heat to the housing 1 or other heat dissipation element.

The fluorine engineered fluid 3 used in the instant disclosure can include perfluorinated compounds such as Fluorinert, especially a perfluorinated compounds with from 5 to 18 carbon atoms, preferably from 9 to 12 carbon atoms, and most preferably 9 carbon atoms. For example, the fluorine engineered fluid 3 can include a material with CAS no. 86508-42-1. Specifically, the fluorine engineered fluid 3 can include an electronic liquid named FLUORINERT Brand Electronic Liquid from the 3M Company, with the product no. of FC-3283.

Furthermore, the fluorine engineered fluid 3 can include a compound represented by the following formula: $R_f$—O—$R_h$—O—$R_f'$. $R_f$ and $R_f'$ are same or different and each is a fluoro-aliphatic group containing one hydrogen atom; $R_h$ is a linear, cyclic or branched alkylene containing from 2 to 8 carbon atoms and at least 4 hydrogen atoms. The compound does not contain —O—$CH_2$—O—.

$R_f$ and $R_f'$ are respectively a hydrophobic group and a hydrophilic group, and are stable, inert and non-polar monovalent groups. In a preferred embodiment, $R_f$ and $R_f'$ are saturated monovalent moieties. In some embodiments of the instant disclosure, $R_f$ and $R_f'$ can include a chlorine atom. Generally, $R_f$ and $R_f'$ each contains at least two carbon atoms, such as from 3 to 20 carbon atoms, preferably from 3 to 7 carbon atoms. $R_f$ and $R_f'$ can each contain a linear, branched or cyclic fluorinated alkylene group or contain both a linear, branched or cyclic fluororinated alkylene group and a linear, branched or cyclic alkylene group. In most of the embodiments of the instant disclosure, the compound does not contain polymerizable alkene group, and optionally contains linkage heteroatoms such as divalent oxygen or trivalent nitrogen (such as $C_3F_7OCFHCF_2$). $R_f$ and $R_f'$ can each contain at least 3 fluorine atoms, preferably 4 fluorine atoms. In some embodiments, $R_f$ and $R_f'$ each contains at least 6 fluorine atoms (such as $CF_3CFHCF_2$, $HCF_2CF_2$, $CFClHCF_2$, $(C_2F_5)(CF_3CFH)CF$, etc). As mentioned above, $R_f$ and $R_f'$ each contains a hydrogen atom. Specifically, $R_f$ and $R_f'$ can each be a fluorinated aliphatic group represented by $C_xF_{2x}H$, in which C is from about 2 to 8, preferably from about 3 or 4. In sum, in a preferred embodiment of the instant disclosure, $R_f$ and $R_f'$ each contains at least 2 carbon atoms and at least 3 fluorine atoms, and each contains 1 hydrogen atom.

$R_h$ is a linear, cyclic or branched alkylene containing from 2 to 8 carbon atoms and at least 4 hydrogen atoms. $R_h$ can contain one or a plurality of linkage heteroatoms. The example of $R_h$ includes alkylene groups or fluororinated alkylene groups.

The fluorine engineered fluid 3 of the instant disclosure generally contains a hydrofluoroether compound which is inert and without the —O—$CH_2$—O— group. In actual implementation, the hydrofluoroether compound mentioned above has relatively high dielectric constant, lower conductivity, and good thermal stability.

It should be mentioned that in some implementations of the present embodiment, the fluorine engineered fluid 3 can further contain perfluoro-tri-n-propylamine (CAS No.: 338-83-0) mixed therein.

Second Embodiment

Reference is made to FIG. 4. In addition to the compounds listed in the above embodiment, the DRAM module M of the instant disclosure can employ a fluorine engineered fluid 3 having a compound represented by the following formula: Y—$R_f$—$CH_2OCH_2R_f'$—Y.

$R_f$ and $R_f'$ each contains at most one hydrogen atom, and are same or different groups selected from the group consisting of linear, cyclic or branched perfluororinated alkylene groups having from 1 to 10 carbon atoms, linear, cyclic or branched partially fluorinated alkylene groups having from 1 to 10 carbon atoms, and derivatives thereof wherein one or more carbon atoms are replaced by catenated nitrogen or oxygen heteroatoms. Y is selected from a group consisting of H, F and $R_fCH_2OCH_2$ groups. The compound contains at least 6 carbon atoms. Preferably, at least one of $R_f$ and $R_f'$ has from 3 to 8 carbon atoms, and at least one of $R_f$ and $R_f'$ has at least 3 fluorine atoms.

Similarly, in the present embodiment, the fluorine engineered fluid 3 can contain perfluoro-tri-n-propylamine.

Third Embodiment

Figure 5:
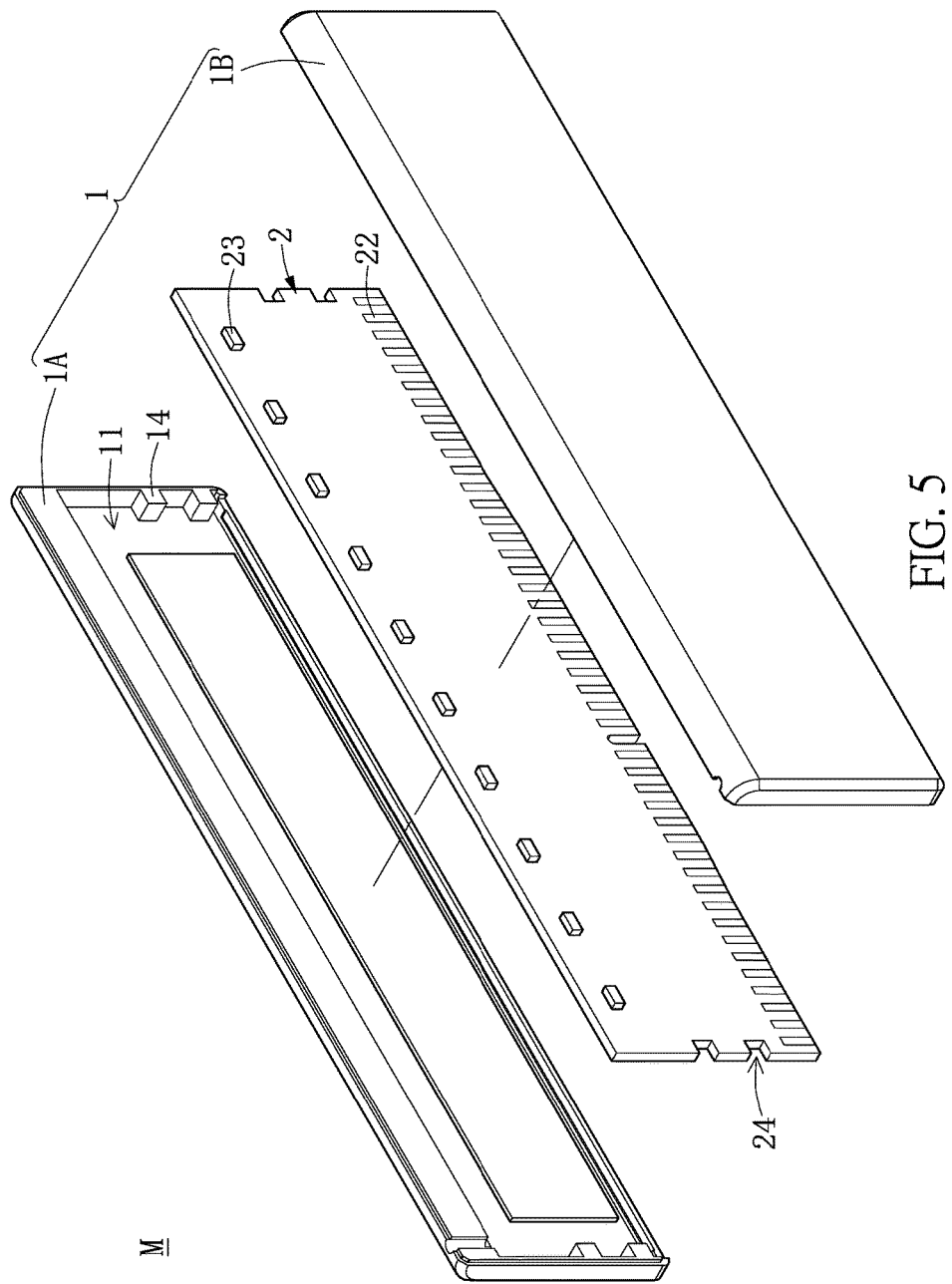
FIG. 5 is an exploded perspective schematic view of a dynamic random access memory module of a third embodiment of the instant disclosure.
Figure 6:
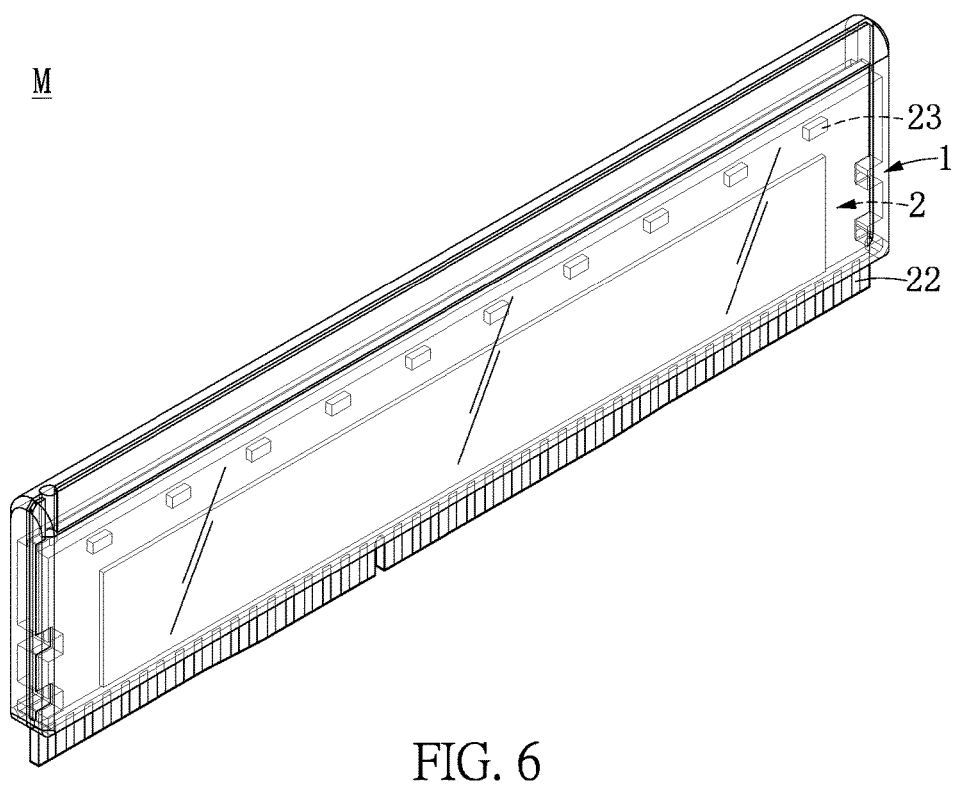
FIG. 6 is an assembly perspective schematic view of a dynamic random access memory module of a third embodiment of the instant disclosure.

The third embodiment is described in accordance to FIG. 4 to FIG. 6. Referring to FIG. 4 to FIG. 6, FIG. 4 is a sectional schematic view of the DRAM module M of the first embodiment, FIG. 5 is a an exploded perspective schematic view of a dynamic random access memory module of the third embodiment of the instant disclosure, and FIG. 6 is an assembly perspective schematic view of a dynamic random access memory module of a third embodiment of the instant disclosure. As shown in the figures, the circuit board 2 of the third embodiment further includes at least a light-emitting module 23 received in the accommodating space 11. In the present embodiment, the light-emitting module 23 includes a red light emitting unit, a green light emitting unit and a blue light emitting unit (not individually numbered) for mixing lights with different colors. However, the instant disclosure is not limited thereto. The light-emitting module 23 can provide a light with only a single wavelength.

In the third embodiment of the instant disclosure, the housing 1 has at least a light transmittable portion, and the light emitted by the light-emitting module 23 can pass through the light transmittable portion for exiting the housing 1. Specifically, in the present embodiment, the housing 1 is made entirely of a transparent material. However, the instant disclosure is not limited thereto. The transparent material can also be used only on a part of the housing 1 corresponding to the light-emitting module 23. Therefore, the appearance of the DRAM module M can be improved. In addition, since a fluorine engineered fluid 3 is sealed in the accommodating space 11 of the DRAM module M, the light-emitting module 23 and the DRAM chip 21 will be both immersed in the fluorine engineered fluid 3. Therefore, the light emitted by the light-emitting module 23 passes through the fluorine engineered fluid 3 before passing through the housing 1, providing a novel visual effect.

Effects of the Embodiment

One of the advantages of the instant disclosure is that the DRAM chip 21 of the dynamic random access memory module M provided by the instant disclosure can be maintained at an optimum working temperature for enabling the DRAM chip 21 to be operated under optimal efficiency by the technical feature of "the fluorine engineering fluid 3 is sealed in the accommodating space 11 of the housing 1" and "the fluorine engineering fluid 3 is thermal connected to the DRAM chip 21".

Furthermore, the instant disclosure includes the technical feature of inputting the circuit board 2 from the liquid inlet 13 into the accommodating space 11 and sealing the liquid inlet 13 by the anti-leakage gel 4. Therefore, the method for manufacturing the DRAM module M can be simplified. In addition, a light-emitting module 23 is disposed on the circuit board 2 for allowing the light emitted from the light-emitting module 23 to sequentially pass through the fluorine engineered fluid 3 and the light transmittable portion of the housing 1 before emitting from the housing 1, thereby achieving a unique visual effect. Moreover, the light-emitting module 23 of the instant disclosure includes a red light emitting unit, a green light emitting unit and a blue light emitting unit. Therefore, in addition to the effect of forming mixed lights with different colors, the appearance and visual effects of the product are improved, thereby increasing the market competitiveness of the product.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A dynamic random access memory module, comprising:
    a housing including an upper casing and a lower casing together defining an accommodating space in the housing and an opening on a side of the housing, wherein a recess is formed on an inner surface of only one of the upper casing and the lower casing, and has a bottom surface connected to the opening;

a circuit board including at least a dynamic random access memory chip disposed thereon and received in the accommodating space, wherein an end of the circuit board has an electrical contact protruding from the opening toward an exterior of the housing, and a side surface of the dynamic random access memory chip directly contacts the bottom surface of the recess; and a fluorine engineering fluid sealed in the accommodating space and thermally connected to the dynamic random access memory chip.

2. The dynamic random access memory module according to claim 1, wherein the fluorine engineering fluid includes a compound represented by the following formula:

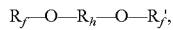

$R_f$—O—$R_h$—O—$R_f'$, wherein $R_f$ and $R_f'$ are same or different and each is a fluoro-aliphatic group containing one hydrogen atom;

wherein $R_h$ is a linear, cyclic or branched alkylene containing from 2 to 8 carbon atoms and at least 4 hydrogen atoms;

wherein the compound does not contain —O—$CH_2$—O—.

3. The dynamic random access memory module according to claim 1, wherein the fluorine engineering fluid includes a compound represented by the following formula:

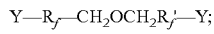

Y—$R_f$—$CH_2OCH_2R_f'$—Y;

wherein $R_f$ and $R_f'$ each contains at most one hydrogen atom and is selected from the group consisting of linear, cyclic or branched perfluororinated alkylene groups having from 1 to 10 carbon atoms, linear, cyclic or branched partially fluorinated alkylene groups having from 1 to 10 carbon atoms, and derivatives thereof;

wherein one or more carbon atoms are replaced by catenated nitrogen or oxygen heteroatoms;

wherein Y is selected from a group consisting of H, F and $R_fCH_2OCH_2$ group;

wherein the compound contains at least 6 carbon atoms.

4. The dynamic random access memory module according to claim 1, wherein the housing includes a liquid inlet filled with an anti-leaking gel.

5. The dynamic random access memory module according to claim 1, wherein the housing has at least a light transmittable portion and the circuit board has at least a light-emitting module disposed thereon, the light-emitting module being received in the accommodating space, a light emitted by the light-emitting module passing through the light transmittable portion.

6. The dynamic random access memory module according to claim 1, wherein the housing is provided with at least a first engaging portion and the circuit board is provided with at least a second engaging portion, the first engaging portion and the second engaging portion being engaged with each other.

7. The dynamic random access memory module according to claim 1, wherein at least one of the upper casing and the lower casing has a plate body formed on the inner surface and facing the circuit board, an upper surface of the plate body that faces away from the inner surface directly contacts an upper surface of the dynamic random access memory chip that faces away from the circuit board.

8. The dynamic random access memory module according to claim 2, wherein $R_f$ and $R_f'$ each contains at least 2 carbon atoms and at least 3 fluorine atoms.

9. The dynamic random access memory module according to claim 3, wherein at least one of $R_f$ and $R_f'$ contains 3 to 8 carbon atoms, and at least one of $R_f$ and $R_f'$ contains at least 3 fluorine atoms.

10. The dynamic random access memory module according to claim 5, wherein the light-emitting module includes a red light emitting unit, a green light emitting unit and a blue light emitting unit.

11. The dynamic random access memory module according to claim 8, wherein the fluorine engineering fluid further includes perfluoro-tri-n-propylamine.

12. The dynamic random access memory module according to claim 9, wherein the fluorine engineering fluid further includes perfluoro-tri-n-propylamine.

* * * * *